United States Patent
Chen et al.

(10) Patent No.: US 9,727,953 B2
(45) Date of Patent: Aug. 8, 2017

(54) METHOD AND APPARATUS FOR RING ARTIFACT REPAIR OF MAGNETIC RESONANCE IMAGES

(71) Applicant: General Electric Company, Schenectady, NY (US)

(72) Inventors: Weitian Chen, Concord, CA (US); Robert Donald Peters, Sussex, WI (US); Zachary William Slavens, New Berlin, WI (US); Kevin Matthew Koch, Wauwatosa, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 65 days.

(21) Appl. No.: 14/755,793

(22) Filed: Jun. 30, 2015

(65) Prior Publication Data

US 2017/0003370 A1 Jan. 5, 2017

(51) Int. Cl.
*G06K 9/00* (2006.01)
*G06T 5/00* (2006.01)
*G06T 7/00* (2017.01)
*G06T 5/20* (2006.01)
*G01R 33/565* (2006.01)

(52) U.S. Cl.
CPC ........ *G06T 5/002* (2013.01); *G01R 33/56536* (2013.01); *G06T 5/20* (2013.01); *G06T 7/0012* (2013.01); *G06T 2207/10088* (2013.01)

(58) Field of Classification Search
CPC ..... G01R 33/56572; G06T 5/002; G06T 5/20; G06T 7/0012; G06T 2207/10088
See application file for complete search history.

(56) References Cited

U.S. PATENT DOCUMENTS

| 5,802,135 | A  | * | 9/1998  | Wohlrab | G06T 5/20 |
|-----------|----|---|---------|---------|-----------|
|           |    |   |         |         | 378/4     |
| 6,668,097 | B1 | * | 12/2003 | Hu      | G06T 5/001 |
|           |    |   |         |         | 375/E7.19 |
| 2009/0074276 | A1 | * | 3/2009 | Doi | G06K 9/6202 |
|           |    |   |         |         | 382/130   |
| 2011/0103670 | A1 | * | 5/2011 | Koch | G01R 33/243 |
|           |    |   |         |         | 382/131   |
| 2011/0275926 | A1 | * | 11/2011 | Du | G01R 33/5635 |
|           |    |   |         |         | 600/410   |

(Continued)

OTHER PUBLICATIONS

Fabio et al; "Field Map Reconstruction in Magnetic Resonance Imaging Using Bayesian Estimation"; Sensors; 2010; pp. 266-279; ISSN 1424-8220.*

(Continued)

*Primary Examiner* — Amara Abdi
(74) *Attorney, Agent, or Firm* — Grogan, Tuccillo & Vanderleeden, LLP

(57) ABSTRACT

An apparatus for detecting and repairing a ring artifact in a multi-spectral magnetic resonance image includes an image processor, which is configured to obtain an off-resonance magnetic field map and a deblurred composite image, to calculate a spatial gradient of the image based on the magnetic field map, to kernel search the spatial gradient, to mask the image, based on the kernel search, in order to identify voxels affected by a ring artifact, and to apply a filter in order to smooth intensities of the voxels identified by the image mask.

12 Claims, 2 Drawing Sheets

(56) References Cited

U.S. PATENT DOCUMENTS

2012/0243298 A1* 9/2012 Hush .................. G11C 13/0004
                                                    365/148
2013/0243298 A1* 9/2013 Bredno .................... G06T 5/50
                                                    382/131

OTHER PUBLICATIONS

International Search Report and Written Opinion for International Application No. PCT/US2016/039538, mail date Oct. 4, 2016, 11 pages.
Fabio Baselice; Giampaolo Ferraioli and Aymen Shabou; "Field Map Reconstruction in Magnetic Resonance Imaging Using Bayesian Estimation"; Sensors; 2010; pp. 266-279; dio: 10.3390/s100100266; ISSN 1424-8220.

* cited by examiner

METHOD AND APPARATUS FOR RING ARTIFACT REPAIR OF MAGNETIC RESONANCE IMAGES

BACKGROUND

Technical Field

Embodiments of the invention relate generally to magnetic resonance imaging. Particular embodiments relate to three-dimensional multi-spectral imaging (3D MSI) for use in the presence of metal.

Discussion of Art

In magnetic resonance imaging (MRI), when human or other animal tissue is subjected to a uniform magnetic field, i.e., a polarizing field B0, the individual magnetic moments of particle spins in the tissue attempt to align with the polarizing field, but precess about the field in random order at their characteristic Larmor frequency. If the tissue is subjected to an RF magnetic field, i.e., excitation field B1, which defines an x-y plane and varies at a frequency near a Larmor frequency of selected particles, the net aligned moment, or "longitudinal magnetization" of those selected particles, may be rotated, or "tipped", into the x-y plane to produce a net transverse magnetic moment. After B1 is terminated, the tipped spins "relax" back into the precession defined by B0, and, as a result, produce RF signals. The RF signals may be received and processed to form an image. In order to form a pixelated image for human interpretation, gradient magnetic fields, Gx, Gy, Gz, are applied to localize the tissue response to B1.

Paramagnetic material such as joint implants or bone screws, for example, can create regions of distortion in the polarizing field B0, which detract from accurate localization of the tissue response to excitation. As one solution, 3D multispectral MRI protocols have been demonstrated using proton-density (PD) and short-tau inversion recovery (STIR) contrasts, and have proven effective for removing bulk distortions around metal implants. It has been demonstrated that heavy frequency overlap of spectral components in 3D multispectral MRI can aid in reducing residual image artifacts. In particular, 3D MSI techniques such as SEMAC, MAVRIC, and MAVRIC SL can substantially reduce bulk-susceptibility artifacts that cofound conventional methods applied in the presence of metal. A common remaining artifact in 3D MSI techniques, however, is the ring artifact found in regions near implants with strong local magnetic induction field gradients. Ring artifacts are limited to the frequency-encoded dimension of a 3D MSI image. The rings follow the progression of the local magnetic induction field gradient as an implant interface is approached. In particular, the compass directions and magic angles relative to implant constructions are prone to the most severe gradients, due to the stronger derivative in these regions of the induced dipole-dominated field distributions.

In view of the above, it is desirable to provide apparatus and methods for repairing ring artifacts. Such apparatus and methods might also be helpful toward repair of oriented image artifacts, generally, e.g., eliminating lens flare in visible light photography.

BRIEF DESCRIPTION

Embodiments of the invention implement a method for detecting and repairing a ring artifact in a multi-spectral magnetic resonance image. The method includes calculating a spatial gradient of a magnetic induction field; kernel searching the spatial gradient; masking the image, based on the kernel search, to identify voxels affected by a ring artifact; and applying a filter to smooth intensities of the voxels identified by the image mask.

Other embodiments implement a method for detecting and repairing a radially-oriented artifact within an image. The method comprises calculating a spatial gradient of a magnetic induction field; kernel searching the gradient; masking the image, based on the kernel search, to identify pixels affected by the radially-oriented artifact; and applying a filter to smooth intensities of the pixels identified by the image mask.

Other embodiments provide an apparatus for detecting and repairing a ring artifact in a multi-spectral magnetic resonance image. The apparatus comprises an image processor, which is configured to obtain an off-resonance magnetic field map and a deblurred composite image, to calculate a magnetic induction gradient of the image based on the magnetic field map, to kernel search the magnetic induction gradient, to mask the image, based on the kernel search, in order to identify voxels affected by a ring artifact, and to apply a filter in order to smooth intensities of the voxels identified by the image mask.

DRAWINGS

The present invention will be better understood from reading the following description of non-limiting embodiments, with reference to the attached drawings, wherein below:

DETAILED DESCRIPTION

Figure 1:
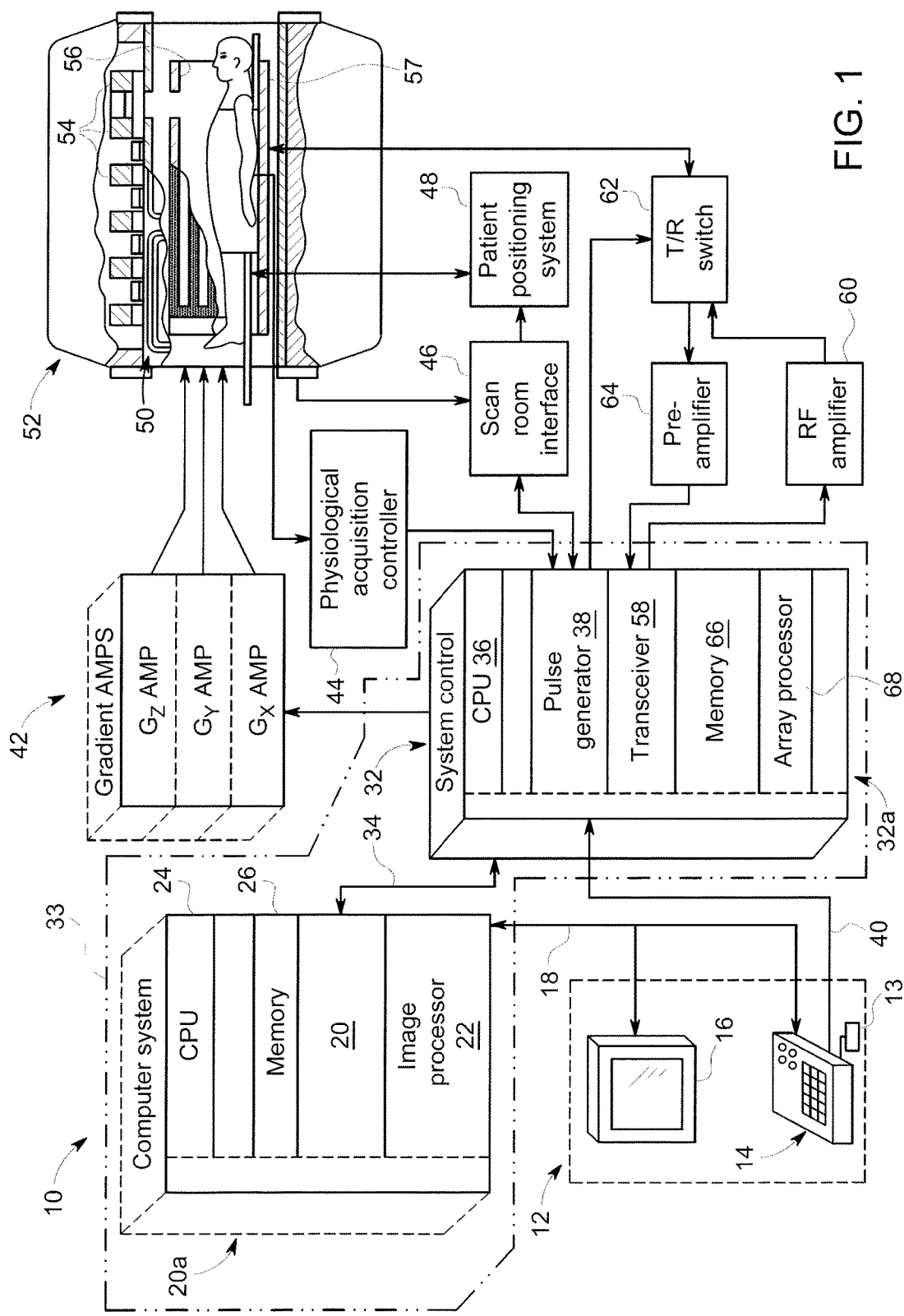
FIG. 1 depicts schematically an exemplary magnetic resonance imaging system that incorporates embodiments of the invention.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to multi-spectral MRI imaging apparatus and methods, embodiments of the invention also are applicable for use, generally, in the detection and repair of radially oriented image defects.

As used herein, the terms "substantially," "generally," and "about" indicate conditions within reasonably achievable manufacturing and assembly tolerances, relative to ideal desired conditions suitable for achieving the functional purpose of a component or assembly.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33.

The MRI system control 32 includes a set of modules connected together by a backplane 32a. These include a CPU module 36 as well as a pulse generator module 38. The CPU module 36 connects to the operator console 12 through a data link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body (transmit and receive) RF coil 56 (which, in operation, provides a transverse magnetic field B1 that is generally perpendicular to B0 throughout the target volume 55). In an embodiment of the invention, RF coil 56 is a multi-channel coil. The MRI apparatus 10 also includes a surface (receive) coil 57, which may be single or multi-channel.

A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56, as well as by the dedicated receive coil 57, and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable the surface RF coil 57 to be used in either transmit mode or receive mode. Conventionally, the surface coil 57 in its receive mode would be coupled to (resonant at the same frequency as) the body coil 56, so as to best receive echoes of the RF pulse transmitted during the transmit mode. However, in case the surface RF coil 57 is not being used for transmission, then it would be necessary to decouple the surface coil 57 from the body coil 56 while the body coil 56 is transmitting the RF pulse.

Conventionally, decoupling would be accomplished using diodes to activate a detuning circuit operatively connected with the surface coil 57. Diode-activated detuning circuits are known to be slow and lossy. By contrast, embodiments of the invention provide apparatus and methods for decoupling the surface coil 57 more quickly and with less loss.

After the multi-channel RF coil 56 and/or the surface coil 57 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the data link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
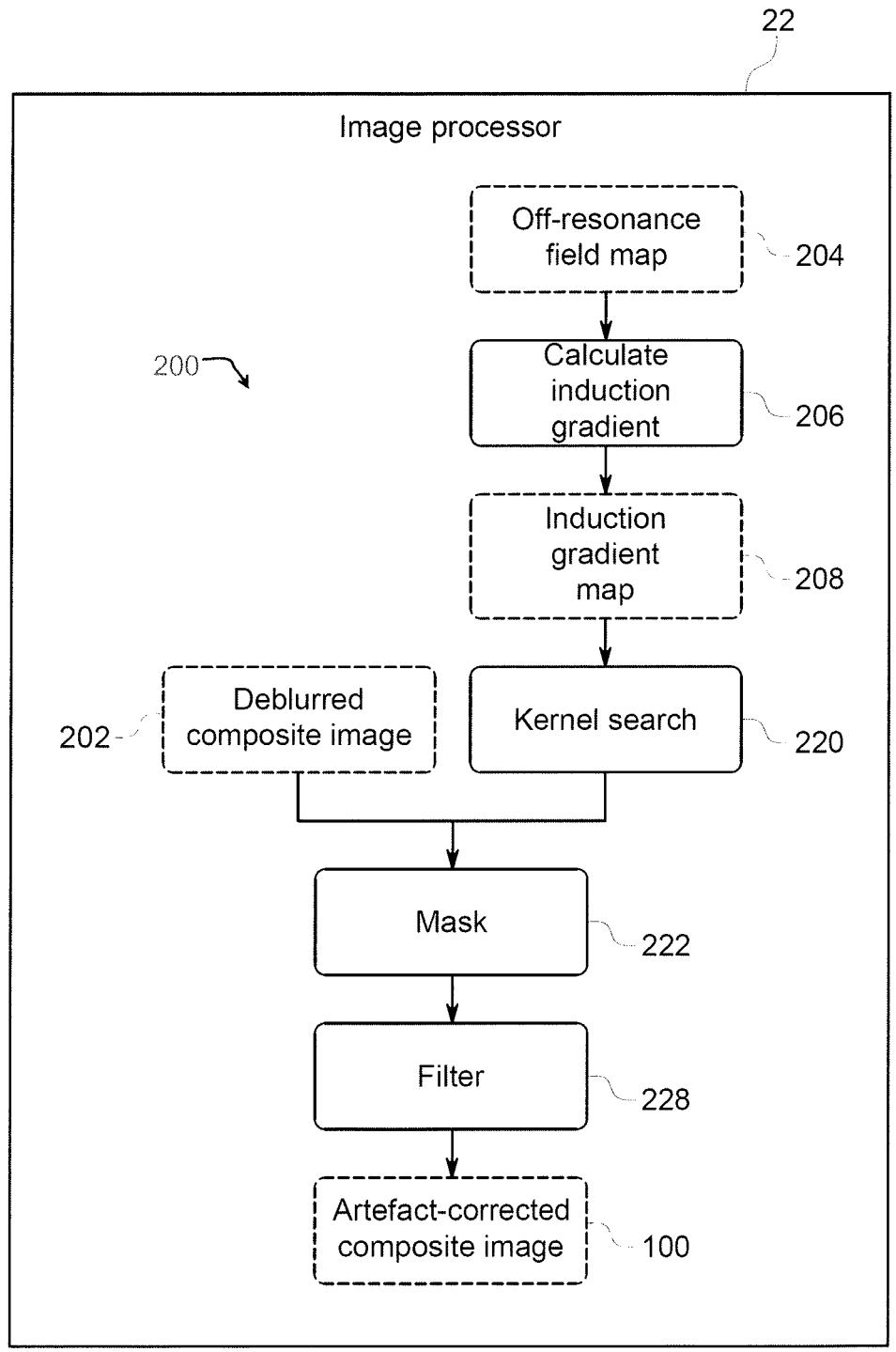
FIG. 2 shows schematically a ring-artifact repair method that is implemented by the MRI system of FIG. 1, according to embodiments of the invention.

As shown in FIG. 2, in an exemplary embodiment of the invention the image processor 22 produces a ring artifact corrected composite image 100 according to a method 200. According to the method 200, a deblurred composite image 202 and an off-resonance field map 204 are obtained by conventional means, e.g., multi-spectral imaging. Then, the image processor 22 calculates 206 a spatial magnetic induction gradient map 208 or "spatial gradient" in the frequency-encoded dimension of the off-resonance map 204. The gradient map 208 is calculated with a relatively high degree of accuracy, even near an implant interface of the field map 204. A high degree of accuracy is achieved by taking a general spatial derivative of the field map.

After calculating 206 the gradient map 208, the image processor 22 performs a kernel search 220 of every frequency-encoded line of the gradient map 208. For locations where the kernel matches the gradient map, the image processor then masks 222 the deblurred composite image 202, thereby excluding pixels that are not in a 3D region that is expected to contain a ring artifact. Advantageously, masking the composite image 202 significantly reduces any likelihood of erroneous repair, i.e. introducing "repair artifacts" in regions that do not actually have ring artifacts to be repaired. Thus, in case the mask 222 does not exclude a pixel, i.e. that pixel is within a contiguous region of pixels that are not masked, then the image processor 22 applies a filter 228 (e.g., a triangular filter; a boxcar filter; a median filter; a mode filter; an elliptic filter) over only the contiguous region that surrounds the pixel. According to certain embodiments, the filter 228 replaces only the intensity of the pixel, not the entire region. Advantageously, this mode of applying the filter 228 prevents any artificial appearance in the corrected regions.

Therefore, embodiments of the invention implement a method for detecting and repairing a ring artifact in a multi-spectral magnetic resonance image. The method includes calculating a spatial gradient of a magnetic induction field; kernel searching the spatial gradient; masking the image, based on the kernel search, to identify voxels affected by a ring artifact; and applying a filter to smooth intensities of the voxels identified by the image mask. For example, the spatial gradient may be calculated in a frequency-encoded dimension. The magnetic induction gradient may be calculated on the basis of an off-resonance magnetic field map. The filter may be one or two or more of a triangular filter, a boxcar filter, a median filter, a mode filter, or an elliptic filter.

Other embodiments implement a method for detecting and repairing a radially-oriented artifact within an image. The method comprises calculating a spatial gradient of a magnetic induction field; kernel searching the gradient; masking the image, based on the kernel search, to identify pixels affected by the radially-oriented artifact; and applying a filter to smooth intensities of the pixels identified by the image mask. The image may be obtained by MRI, in which case the gradient may be a magnetic induction gradient of the image. Such a magnetic induction gradient may be obtained on the basis of a frequency-encoded magnetic field map, which may be an off-resonance field map. The filter may be one or two or more of a triangular filter, a boxcar filter, a median filter, a mode filter, or an elliptic filter.

Other embodiments provide an apparatus for detecting and repairing a ring artifact in a multi-spectral magnetic resonance image. The apparatus comprises an image processor, which is configured to obtain an off-resonance magnetic field map and a deblurred composite image, to calculate a magnetic induction gradient of the image based on the magnetic field map, to kernel search the magnetic induction gradient, to mask the image, based on the kernel search, in order to identify voxels affected by a ring artifact, and to apply a filter in order to smooth intensities of the voxels identified by the image mask. The magnetic induction gradient may be obtained on the basis of a frequency-encoded magnetic field map, which may be an off-resonance field map. The filter may be one or two or more of a triangular filter, a boxcar filter, a median filter, a mode filter, or an elliptic filter.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, tennis such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus and methods, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for detecting and repairing a ring artifact in a multi-spectral magnetic resonance image, comprising:
   calculating a spatial gradient of a magnetic induction field;
   kernel searching the spatial gradient;
   masking the image, based on the kernel search, to identify voxels affected by a ring artifact; and
   applying a filter to smooth intensities of the voxels identified by the image mask.

2. The method of claim 1 wherein the spatial gradient is calculated in a frequency-encoded dimension.

3. The method of claim 1 wherein the spatial gradient is calculated on the basis of an off-resonance magnetic field map.

4. The method of claim 1 wherein the filter is one of a triangular filter, a boxcar filter, a median filter, a mode filter, or an elliptic filter.

5. The method of claim 1 wherein the filter comprises two or more of a triangular filter, a boxcar filter, a median filter, a mode filter, or an elliptic filter.

6. A method for detecting and repairing a radially-oriented artifact within an image, comprising:
   calculating a spatial gradient of the magnetic induction field;
   kernel searching the spatial gradient;
   masking the image, based on the kernel search, to identify pixels affected by the radially-oriented artifact; and
   applying a filter to smooth intensities of the pixels identified by the image mask.

7. The method of claim 6 wherein the filter is one of a triangular filter, a boxcar filter, a median filter, a mode filter, or an elliptic filter.

8. An apparatus for detecting and repairing a ring artifact in a multi-spectral magnetic resonance image, comprising:
   an image processor configured to obtain a magnetic field map and a deblurred composite image, to calculate a magnetic induction gradient of the image based on the magnetic field map, to kernel search the magnetic induction gradient, to mask the image, based on the kernel search, in order to identify voxels affected by a ring artifact, and to apply a filter in order to smooth intensities of the voxels identified by the image mask.

9. The apparatus of claim 8 wherein the magnetic induction gradient is calculated in a frequency-encoded dimension.

10. The apparatus of claim 8 wherein the magnetic induction gradient is calculated on the basis of an off-resonance magnetic field map.

11. The apparatus of claim 8 wherein the filter is one of a triangular filter, a boxcar filter, a median filter, a mode filter, or an elliptic filter.

12. The apparatus of claim 8 wherein the filter comprises two or more of a triangular filter, a boxcar filter, a median filter, a mode filter, or an elliptic filter.

* * * * *